United States Patent [19]
Forrest et al.

[11] Patent Number: 5,477,075
[45] Date of Patent: Dec. 19, 1995

[54] SOLID STATE PHOTODETECTOR WITH LIGHT-RESPONSIVE REAR FACE

[75] Inventors: Roger W. Forrest, Thousand Oaks; Harold S. Melkonian, Ventura, both of Calif.

[73] Assignee: Advanced Photonix, Inc., Camarillo, Calif.

[21] Appl. No.: 357,703

[22] Filed: Dec. 16, 1994

[51] Int. Cl.$^6$ ............................................. H01L 31/0232
[52] U.S. Cl. ........................ 257/432; 257/433; 257/434; 257/680
[58] Field of Search .................................. 257/433, 434, 257/461, 463, 464, 465, 459, 447, 448, 443, 680, 432

[56] References Cited

U.S. PATENT DOCUMENTS 4,158,133  6/1979  Spaeth et al. ..................... 257/432 X

FOREIGN PATENT DOCUMENTS 58-04953  1/1983  Japan ................................. 257/680
4180255  6/1992  Japan ................................. 257/433

Primary Examiner—William Mintel
Attorney, Agent, or Firm—Herbert M. Shapiro

[57] ABSTRACT

A solid state photodiode is configured to have its rear face light responsive and is electrically connected to a lead frame or flexible carrier with conductor traces, which includes an aperture to allow light to impact the rear face. A photodiode with light responsive front and rear faces, with or without filters, permits various applications to be implemented relatively inexpensively when compared to prior art systems.

8 Claims, 3 Drawing Sheets

5,477,075

SOLID STATE PHOTODETECTOR WITH LIGHT-RESPONSIVE REAR FACE

FIELD OF THE INVENTION

This invention relates to semiconductor photodiodes having a rear side, light responsive face

BACKGROUND OF THE INVENTION

Semiconductor photodiodes are well known and commercially available. Typically, such a photodiode has a PN-junction formed adjacent to a front face of the device with electrodes formed on that face. The rear face of the photodiodes includes an opaque electrical contact.

Photodiodes having light responsive rear faces also have been made for a variety of applications, mostly military. Such devices have opaque surface layers on the front face precluding the possibility of light reaching that face. The rear face also includes electrodes. The devices are quadrature devices having four discrete sensor areas and are used, for example, for laser guided missile controls.

Deposited surface filters for photodiode also are disclosed in U.S. Pat. No. 4,158,133 for front face wavelength adjustment of incident light. There is no showing of rear face filter usage or use of both front and rear face light response with or without filters on one of or both such faces.

BRIEF DESCRIPTION OF AN ILLUSTRATIVE EMBODIMENT OF THIS INVENTION

In accordance with the principles of this invention, a semiconductor photodiode includes a light responsive rear surface free of overlying electrodes. The device is packaged rein: face down onto a mating lead frame which has an aperture in it to permit light to reach the rear face of the device. Electrical contact to the device is made via wire bonds to electrodes formed on the front face of the device, the internal structure of the semiconductor die being configured to permit operation with all electrical contact being made to the front face.

In one embodiment, the rear face includes an overlying filter to adjust the range of wavelengths of the incident light. In another embodiment, no filter is employed. In still other embodiments, the front face of the device is coated with an opaque layer to preclude incident light on the front face with or without a filter on the rear face in other embodiments, the front face of the device is also light responsive thus permitting the provision of a data channel and a reference channel in a single device simplifying various applications where two photodiodes, two amplifiers and a comparator would otherwise be necessary.

DETAILED DESCRIPTION OF ILLUSTRATIVE EMBODIMENTS OF THIS INVENTION

Figure 1:
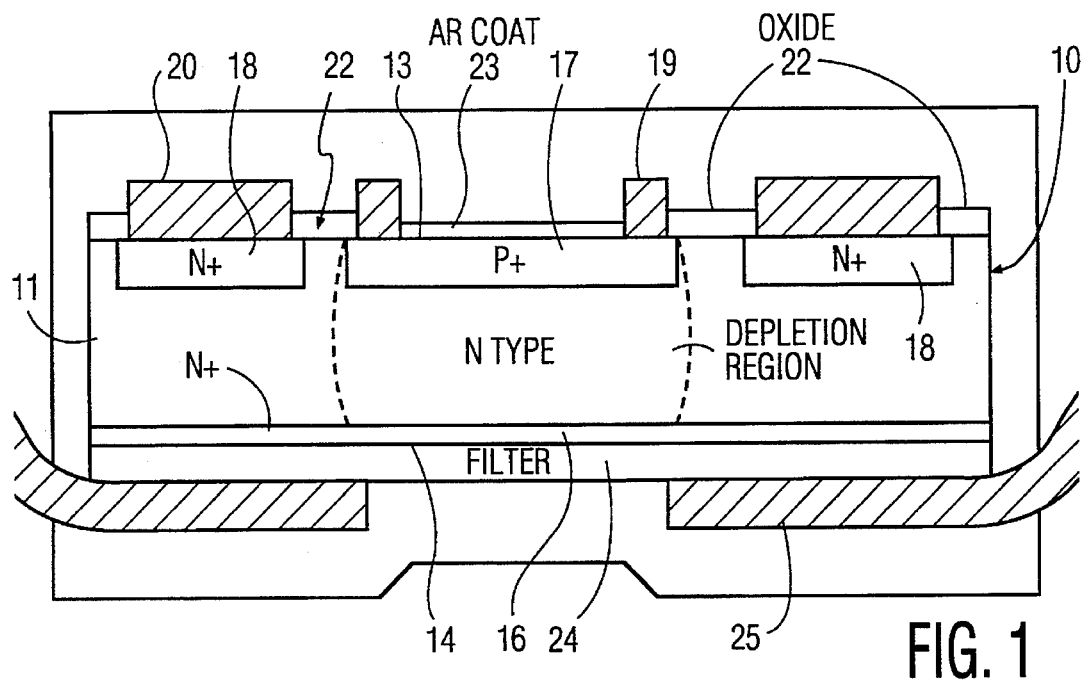
FIG. 1 and 2 are a schematic cross section and top view respectively, of a double sided photodiode in accordance with the principles of this invention.
Figure 2:
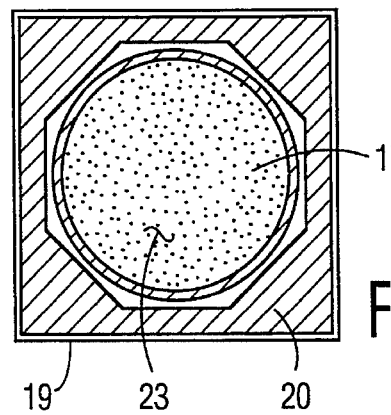

FIG. 1 shows a schematic cross section of a photodiode 10 in accordance with the principles of this invention. The photodiode includes an N-type body region 11 having front and rear faces 13 and 14 respectively. The rear face includes an N+ surface layer 16 extending over the entire rear face. The front face, 13, includes a circular shaped central P+ surface region 17 and an N+ region 18 which encompasses the P+ surface region. Electrodes 19 and 20 are formed on front surface 13 and are connected to P+ region 17 and to N+ region 18 respectively. The surface area between electrodes 19 and 20 is passivated with a $SiO_2$ layer 22 typically thermally grown. The area encompassed by electrode 19 is coated with anti-reflective coating designated 23 in FIG. 2.

The rear face 14 of photodiode 11 is covered with a filter 24 which adjusts the wavelength characteristics of light incident to face 14. The rear face also includes a metal framing layer 25 which provides mechanical stability to the device.

Figure 3:
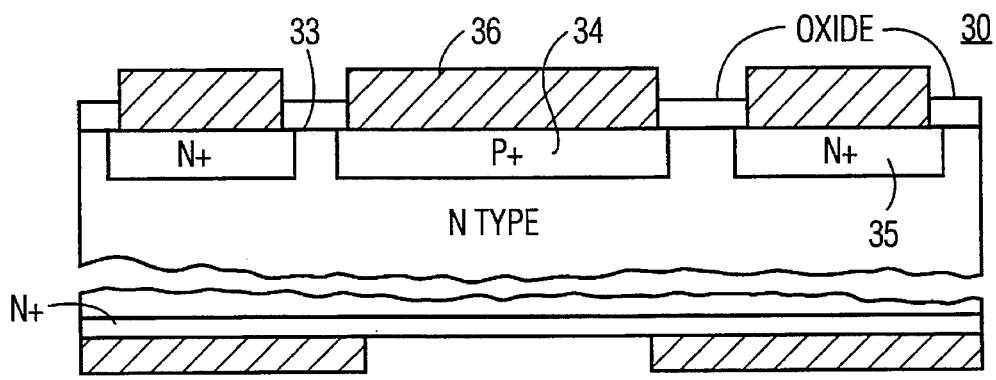
FIG. 3 is a schematic cross section of a photodiode of the type shown in FIG. 1 with the front face occluded.

FIG. 3 shows a portion of a photodiode 30 of the type shown in FIG. 1 including a front surface 33 with a central, circular P+ region 34 and an encompassing N+ region 35. In this embodiment, a metal layer 36 covers the entire P+ region thus preventing light from reaching the front face of the photodiode. Such a device need not have a filter on the rear face as shown in FIG. 3 as is also true of an embodiment of the type shown on FIG. 1.

Figure 4A:
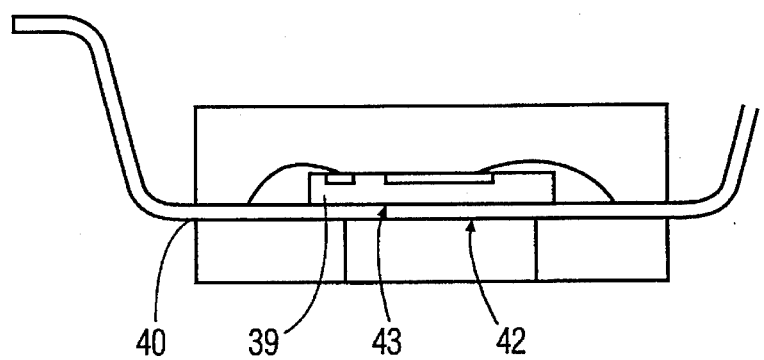
FIG. 4 A and 4 B are schematic side views of a photodiode of the type shown in FIG. 1 mounted on a conductor trace and on a flexible circuit with a stiffener, respectively.
Figure 4B:
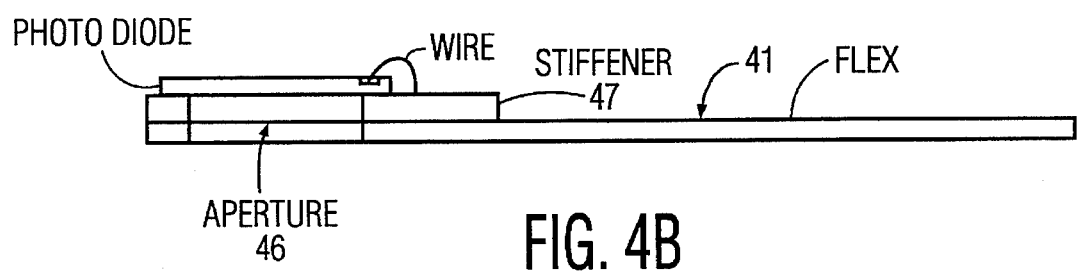

FIGS. 4A and 4B show two embodiments where a sensor is mounted on a flexible circuit and on a rigid lead frame respectively.

FIG. 4A shows an embodiment where a rear face, light sensitive photodiode 39, is positioned face down on a rigid lead frame which includes an aperture to permit light to reach the rear face. The lead frame is designated 40 in FIG. 4A but may comprise a flexible carrier of, for example, Kapton with metal traces on the surface 41 as viewed in FIG. 4B. The aperture is designated 42 in FIG. 4A, allowing light to reach rear face 43. The aperture is designated 46 in FIG. 4B. Such an arrangement as shown in FIG. 4B permits a low profile sensor to be mounted electrically in a manner to permit relatively high sensitivity at relatively low cost where the rear face is free of incumbrances (i.e. electrodes) for ease of deposition of a filter, if desired. This type of embodiment is particularly useful for medical testing but requires a stiffener 47 in practical embodiments.

Figure 5:
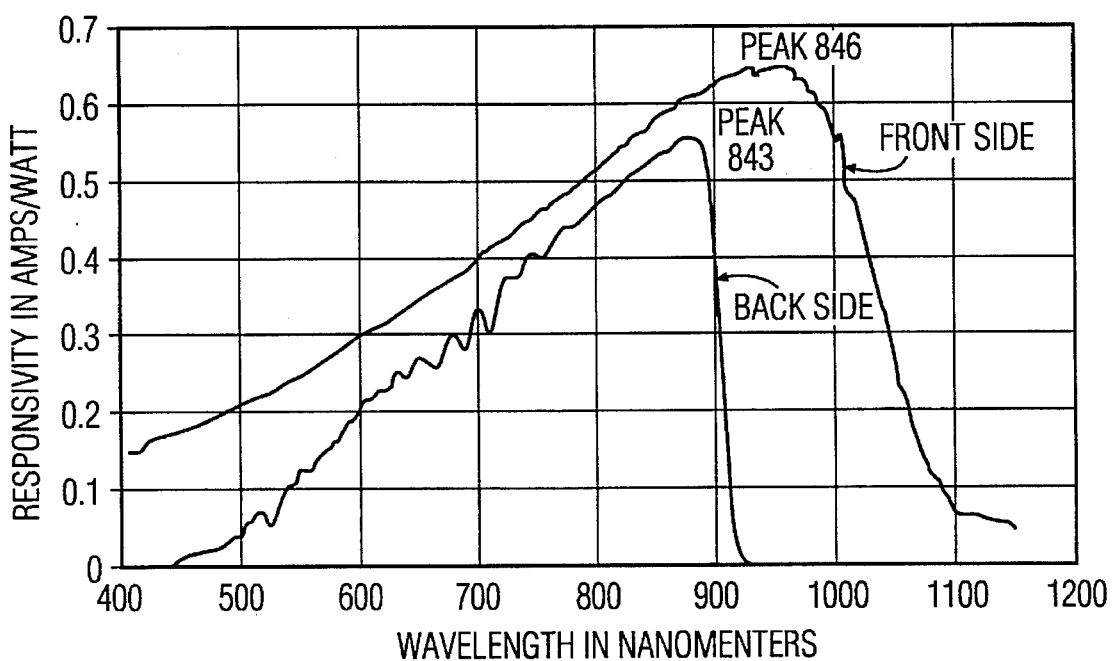
FIG. 5 is a responsivity curve for the photodiodes of FIG. 1.

FIG. 5 is a typical plot of silicon sensitivity, plotting responsivity in amperes per watt verses wavelength in nanometers. It is clear from the figure that the front face wavelength distribution extends from less than 400 nanometers to over eleven-hundred with a peak at 946 nanometers. The rear face wavelength distribution extends from about 450 nanometers to about 930 nanometers with a peak at 864 nanometers. A typical rear face filter of a combination of silicon-oxides and metalic-oxides changes the wavelength distribution of incident (white) light to more closely match the rear face curve of FIG. 5.

Figure 6:
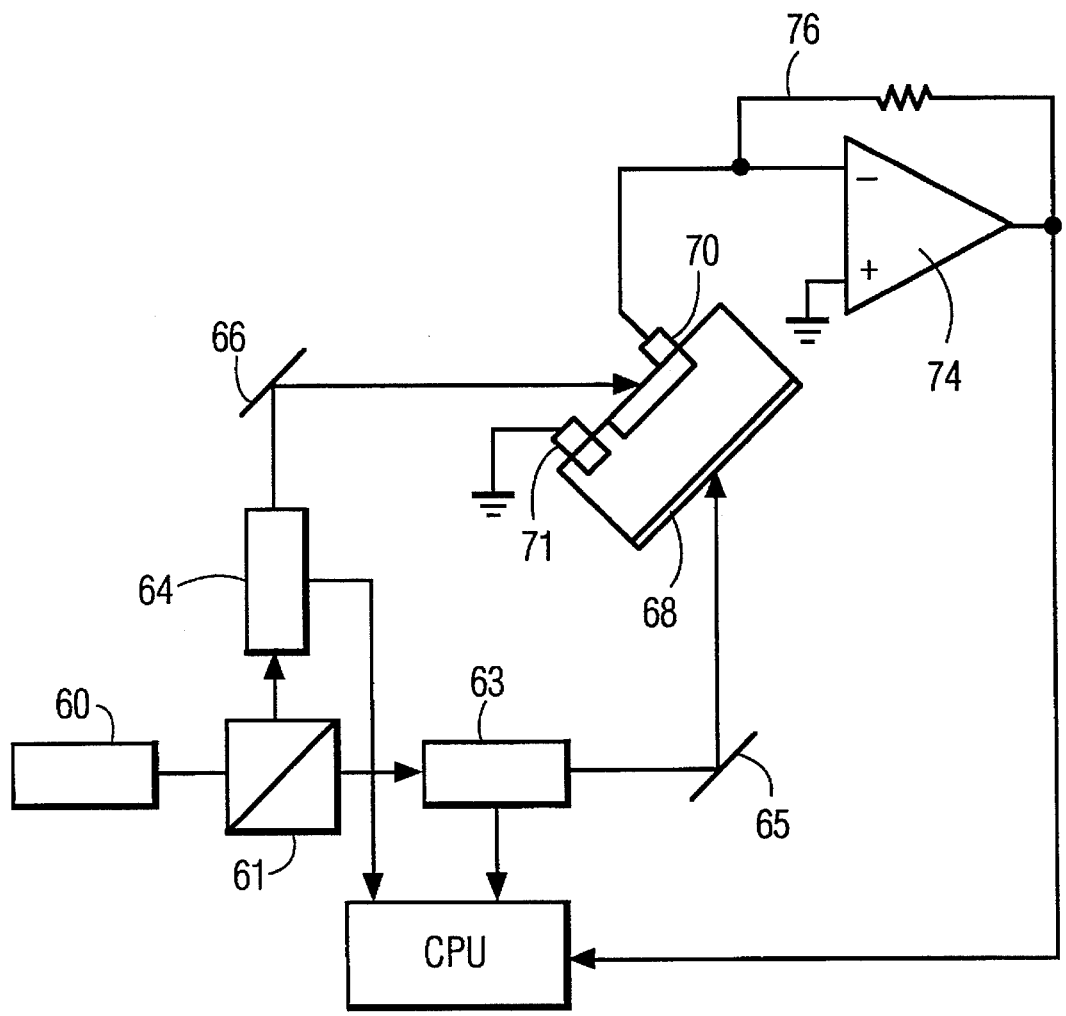
FIG. 6 is a system schematic for an application of the two sided photodiode of FIG. 1.

FIG. 6 shows a schematic of a system which employs a two-sided, light responsive device of the type shown in FIG. 1. The system employs a light source 60 directing light at beam (or color) splitter 61. Splitter 61 diverts light into modulators 63 and 64 to mirrors 65 and 66, respectively. Mirrors 65 and 66 direct light to the rear face and to the front face of two sided photodiode 68. Photodiode 68 includes an electrode 70 connected to the P+surface region (see 19 of FIG. 1) and an electrode 71 connected to the N+region (see 18 of FIG. 1). Electrode 71 is connected to ground as shown in FIG. 6. Electrode 70 is connected to the negative input of an inverting amplifier 74. The positive input of amplifier 74 is connected to ground. A feedback loop 76 connects the amplifier output to the negative input. This system implements a data path adjusted with respect to a reference path by a single photodiode and may be used, for example, to adjust various systems correcting, on-the-fly, any unwanted drift characteristic of the system. A prior art system of this type employs two photodiodes each connected to its own amplifier the outputs of which are connected to inputs to a comparator. Such a system was disclosed, for example, at the seventh International Symposium of IMEKO Technical Committee on Photon-Detectors, Braunschweig, West Germany, May 17–19, 1976 in a paper entitled "Spectral Radiometry; A New Approach Based on Electro-Optics" by J. Geist, M. A. Lind, R. Schoefer, and E. F. Salewski. A significant cost advantage is achieved when compared to such prior art systems. An illustrative photodiode herein has very low capacitance (<or equal 5 pfd @15 Volts) and a high frequency of operation (<or equal 8 ns rise/fall time) and has the responsivity curve of FIG. 5 on the front face.

What is claimed is:

1. A Semiconductor photodiode, said photodiode comprising a substrate including a body region of a first conductivity type, said body region having a surface region of a second conductivity type, adjacent a front face of the photodiode and defining a PN junction with said body region, said photodiode including a doped surface region adjacent a rear face of said photodiode, said photodiode also including a doped frame region at said front surface encompassing but spaced apart from said surface region, said photodiode including first and second electrodes on said front face in contact with said first and second doped region respectively, said photodiode being mounted with said rear face abutting a lead frame, said lead frame having therein an aperture aligned with said rear face for permitting light to reach said rear face through said aperture, said first and second electrodes being connected to said lead frame via wire bonds.

2. A photodiode as in claim 1 wherein said semiconductor is silicon.

3. A photodiode as in claim 2 wherein said rear face includes a filter for eliminating from light incident to said rear face a portion of the range of wavelengths of said light for matching incident light to the responsivity of silicon.

4. A photodiode as in claim 1 including an opaque layer on said front face to preclude light therefrom.

5. A photodiode as in claim 3 including an opaque layer on said front face to prevent light from reaching that face.

6. A photodiode as in claim 1 in combination with a light source means for directing light at said front and rear faces wherein said electrodes to said P+ region and said N+ region are connected to the negative input of an amplifier and to ground, respectively, for providing a data channel and a reference channel for correcting for variations in light from said light source means.

7. A photodiode as in claim 6 wherein said light source means comprises a light source, a beam splitter for dividing light from said light source into first and second paths, first and second modulators in said first and second paths and first and second mirrors in said first and second paths for directing light at said front and rear faces respectively.

8. A photodiode as in claim 1 wherein said body region is N-type, said surface region is p-type and said frame region is N+.

\* \* \* \* \*